United States Patent [19]

Chaki et al.

[11] 4,428,322
[45] Jan. 31, 1984

[54] INDICATOR MECHANISM IN A PUSHBUTTON TUNER

[75] Inventors: Takao Chaki; Nobuaki Watanabe; Takao Kanai, all of Saitama, Japan

[73] Assignee: Clarion Co., Ltd., Tokyo, Japan

[21] Appl. No.: 279,471

[22] Filed: Jul. 1, 1981

[30] Foreign Application Priority Data

Jul. 3, 1980 [JP] Japan ............................. 55-92849[U]
Jul. 7, 1980 [JP] Japan ............................. 55-94537[U]
Jul. 9, 1980 [JP] Japan ............................. 55-95596[U]

[51] Int. Cl.³ .......................... G01D 13/22; H03J 1/02
[52] U.S. Cl. ..................................... 116/261; 116/241
[58] Field of Search ............... 116/261, 241, 262, 281, 116/305, 303, 279, 285, 283, DIG. 28; 74/10.27, 483 PB; 308/2 R, 22; 248/226.5; 411/523, 522, 520

[56] References Cited

U.S. PATENT DOCUMENTS

| 2,281,093 | 4/1942 | Benton | 116/261 |
| 2,368,743 | 2/1945 | Burton | 116/261 |
| 3,799,466 | 3/1974 | Adams | 248/226.5 |
| 4,201,148 | 5/1980 | Bizzak | 116/241 |

FOREIGN PATENT DOCUMENTS 762884 12/1956 United Kingdom ................. 308/22

Primary Examiner—Charles E. Frankfort
Assistant Examiner—Denis E. Corr
Attorney, Agent, or Firm—Russell E. Hattis; Stephen R. Arnold

[57] ABSTRACT

An indicator mechanism in a pushbutton tuner characterized in that there is provided a front plate horizontally extending from the top end of the tuner casing. The front plate is integrally formed with two-stepped protrusions, the lower one of which is inserted in a central bore of a slidable plate mounted on the front plate so that the slidable plate can pivot about the lower protrusion as an axis. The indicator mechanism further comprising a plate spring having an open rectangular configuration for seizing the front plate between its upper and lower plates. The plate spring is also formed with a through bore in its upper plate for receiving the upper protrusion of the front plate. The front plate is further formed with projections as high as the lower protrusion by which the upper plate of the plate spring is supported.

10 Claims, 16 Drawing Figures

U.S. Patent Jan. 31, 1984 Sheet 1 of 3 4,428,322
FIG. 1
PRIOR ART
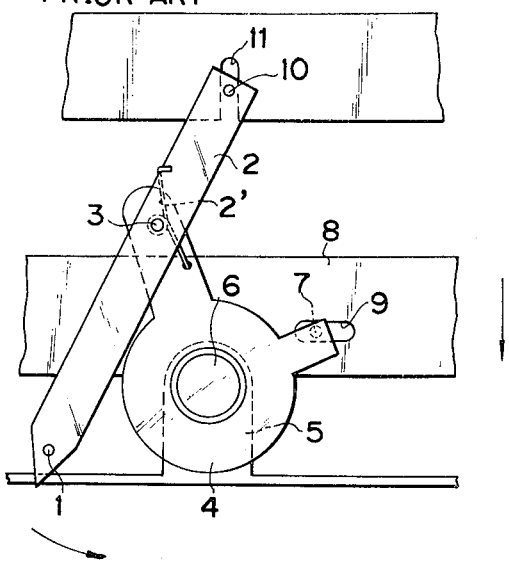
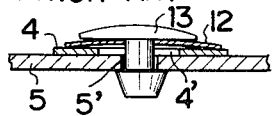
FIG. 2 PRIOR ART
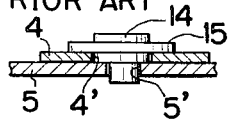
FIG. 3 PRIOR ART
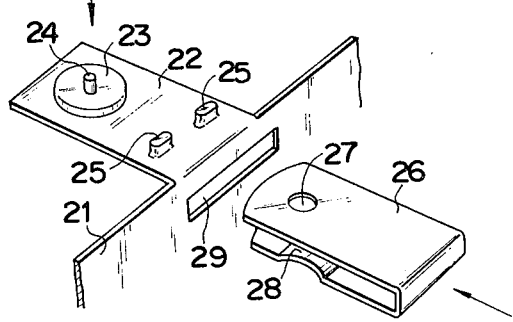
FIG. 4

FIG. 8A
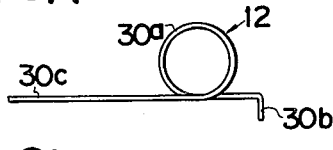
FIG. 9A
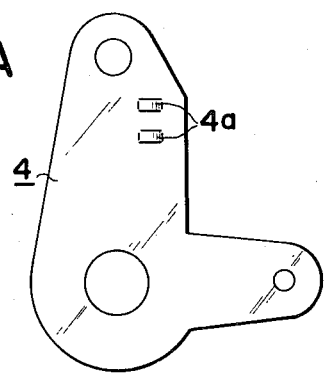
FIG. 8B
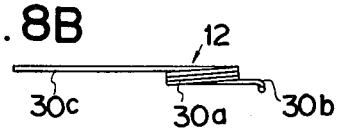
FIG. 10
FIG. 9B
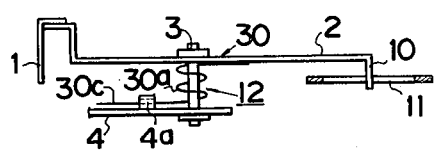
FIG. 11
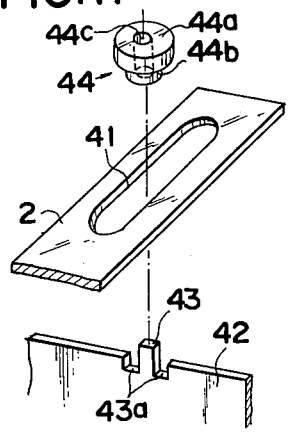
FIG. 12
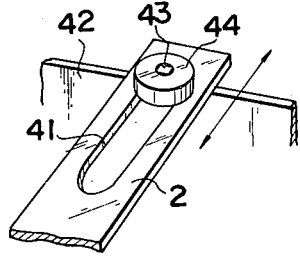
FIG. 14
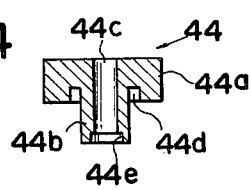
FIG. 13
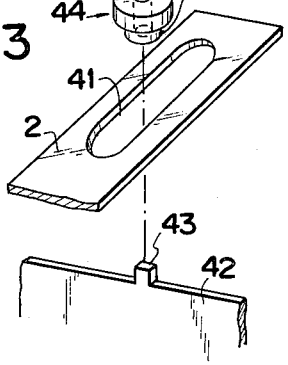

INDICATOR MECHANISM IN A PUSHBUTTON TUNER

BACKGROUND OF THE INVENTION

This invention relates to an indicator mechanism in a pushbutton tuner, and more particularly to improvements in a mechanism to mount a slidable plate for moving a pointer arm supporting an indicating pointer on a front plate formed on a casing of the tuner.

A well-known indicator structure, as shown in FIG. 1, generally comprises a pointer arm 2 provided with an indicating pointer 1 at the top end thereof. A slidable plate 4 is pivotally connected to the pointer arm 2 by a pin 3 in one hand and on the other hand, it is pivotally mounted on a front plate 5 formed on the casing by means of a pivot 6. In the lower surface of the slidable plate 4 is supported an end of a pin 7. The other end of the pin 7 is inserted in a long slit 9 formed in a slidable bar 8 which is arranged to interlock with a pushbutton (not shown) of the tuner. When the pushbutton is pushed to cause movement of the slidable bar 8, the slidable plate 4 engaged with the slidable bar 8 through the long slit 9 and the pin 7 is rotated thus to move the pointer arm 2 to a predetermined position. As illustrated the pointer arm 2 is formed with a protrusion 10 at the base end thereof and the protrusion 10 is disposed in a guide slit 11 formed in a rear wall of the casing, thus allowing the pointer arm 2 to pivot on its base end.

The reference numeral 2' designates a torsion spring provided around the pin 3 in order to avoid deviation of the indicating pointer 1, which may be caused by looseness at the junction between the pointer arm 2 and the slidable plate 4.

FIG. 2 and FIG. 3 show more clearly how the slidable plate 4 is pivotally mounted on the front plate 5 of the casing.

In FIG. 2, the front plate 5 and the slidable plate 4 are shown put together so that their through bores 5' and 4' are aligned with and adjacent each other. A plate spring 12 is then laid over the slidable plate 4 and a plastic rivet 13 secures these three elements together.

Since the rivet 13 is made of a plastic material, a loose connection of the elements is possible, which is reduced by the plate spring 12. However, the plate spring 12 is not effective enough to prevent the junction from loosening when a sudden force is applied to the slidable plate. For example, looseness at the junction between these elements is caused by impacts generated by acceleration applied to the pointer arm and the slidable plate when the pushbutton is pushed, thus causing deflection of the indicating pointer 1.

As shown in the modified prior art embodiment of FIG. 3, a pin 14 is fixed on the front plate 5. The pin 14 is inserted in the through bore 4' of the slidable plate 4, and thereafter, the front plate 5 and the slidable plate 4 are fixed together by means of an E-ring 15 provided on the pin 14. However, such a construction is expensive.

OBJECT OF THE INVENTION

It is therefore an object of the present invention to provide an indicator mechanism in a pushbutton tuner in which a front plate and a slidable plate can be securely supported.

SUMMARY OF THE INVENTION

In accordance eith the present invention, there is provided an indicator mechanism in a pushbutton tuner which comprises:
  an arm member provided with an indicating pointer at the top end thereof;
  a slidable member pivotally connected to said arm member;
  a front plate member extending from a casing of the pushbutton tuner;
  a means interlocking with a pushbutton of the pushbutton tuner thus to cause pivotal movement of said slidable member;
  a protrusion formed on said front plate member for engaging with a bore formed in said slidable member so as to pivotally support said slidable member; and
  a holding member having an open-rectangular configuration supported on said front plate member so as to tightly hold said slidable member between opposed plates thereof.

BRIEF DESCRIPTION OF THE DRAWINGS

FIG. 1 shows a plan view illustrating a conventional indicator mechanism in a pushbutton tuner;

FIG. 2 and FIG. 3 show sectional veiws of different constructions for interconnecting some of the elements shown in FIG. 1, FIG. 4 shows a perspective exploded view of an embodiment of the indicator mechanism according to the present invention;

FIGS. 8A and 8B show a plan and a front elevation, respectively, of a torsion-coil spring used in the present invention;

FIG. 9A and FIG. 9B show a plan and a front elevation, respectively, of a slidable plate used in the present invention;

FIG. 10 shows a side view illustrating the mounting structure for the elements of FIG. 8;

FIG. 11 shows a perspective exploded view seperated illustrating a mounting structure according to the present invention;

FIG. 12 shows a perspective view of the assembled condition of the parts of FIG. 11; and FIGS. 13 and 14 show a modification of the mounting structure of FIGS. 11 and 12.

DETAILED DESCRIPTION OF THE PREFERRED EMBODIMENTS

Figure 5:
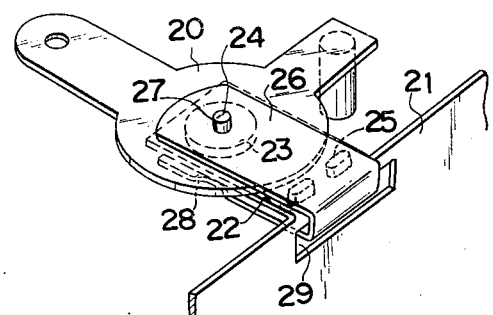
FIG. 5 shows a perspective view of the elements of FIG. 4 in assembled condition.

The present invention will now be described in detail referring to the preferred embodiments as shown in the accompanying drawings of FIGS. 4-14.

The reference numeral 20 designates a slidable plate (planar member) and reference numeral 20' a central bore (first bore) formed in a central portion of the slidable plate 20 for engaging the front plate.

Further, the reference numeral 21 designates a front wall of the casing and 22 a front plate (plate member) rearwardly and horizontally extending from the upper end of the casing. The front plate 22 is integrally formed on the upper surface thereof with a lower protrusion 23 (first protrusion) having a relatively large diameter and an upper protrusion 24 (second protrusion) having a smaller diameter and upwardly projecting from the lower protrusion 23 as by press molding, etc. The lower protrusion 23 is to serve as a pivot for the slidable plate 20 and is arranged to have a height corresponding to or a little greater than the thickness of the slidable plate 20. It has a circular cylindrical configuration for pivoting engagement with the central bore 20' of the slidable plate 20. On the other hand, the upper protrusion 24 is provided for securing a plate spring (to be described), and any configuration will do provided that it projects from the upper surface of the lower protrusion 23. Further on the upper surface of the front plate 22 there are formed a pair of projections 25 for keeping a plate spring in a raised position. The projections 25 have the same height as that of the lower protrusion 23 and is formed in a portion of the plate 22 away from the lower protrusion 23 and near the front wall 21 of the casing so as to be clear of not to get the slidable plate 20.

The reference numeral 26 (FIG. 4) designates a plate spring having an open-rectangular section. The plate spring 26 is provided at a top end portion of the upper (second) plate thereof with a through bore 27 (second bore) for engaging with the upper protrusion 24 of the front plate 22. The lower plate (first) of the plate spring 26 is formed with a concavity portion 28 upwardly rising (toward the inside of the plate spring 26) in order to increase the spring force.

Further, the front wall 21 of the casing is provided near the front plate 22 with a slit 29 parallel with the front plate 22 and into which the lower plate of the plate spring 26 is inserted.

The above members and parts are mounted as follows. First, the slidable plate 20 is laid over the front plate 22 so as to engage the lower protrusion 23 with the central bore 20' of the slidable plate 20. Thereafter (see FIG. 5), the plate spring 26 is mounted in such a manner that its lower plate passes through the slit 29 of the front wall of the casing in contacting engagement with the lower surface of the front plate 22. The upper plate of the plate spring 26 is laid over the lower protrusion 23 so as to receive the upper protrusion 24 in its through bore 27. The plate spring 26 is provided at the central portion of its lower plate with the concavity 28 as described above, so that the distance between the upper and lower plates is narrower in the region of the concavity 28. Thus, the spring plate 26 can compressively seize the front plate 22 and the lower protrusion 23 between its upper and lower plates to be thereby kept captive with respect to the casing. At the same time the slidable plate 20 engaging the lower protrusion 23 is prevented from disengagement from the front plate 22 due to the pressure applied by the plate spring 26. In this case, the upper plate of the plate spring 26 is supported by the upper surface of the lower protrusion 23 and the top ends of the projections 25 so as not to displace downwardly, resulting in keeping a predetermined distance between the front plate 22 and the upper plate of the plate spring 26. Therefore, there is no possibility of too close a contact of the slidable plate 20 with the front plate 22 and the plate spring 26.

As described above, in the indicator mechanism according to the invention, there are provided two-stepped projections 23 and 24 to serve as a pivot of the slidable plate and a stopper of the plate spring, respectively, and therefore, there is no need of providing a specific pivot of the slidable plate, which has been requisite in a conventional structure. This results in simplified structure and reduction of parts. Also, these parts can easily be assembled solely by inserting the plate spring from the front wall of the casing. Further, an appropriate press-fitting force between the slidable plate and the front plate can be obtained by adjusting the spring force of the plate spring 26 so as to completely prevent those plates from loosening.

Particularly according to the invention, there are formed projections 25 (FIG. 4) each having a substantially same height as the lower protrusion on the front plate, and therefore, the upper plate of the plate spring is supported by the projections so as not to contact the slidable plate 20, thus securing smooth pivotal movements of the slidable plate.

Figure 6:
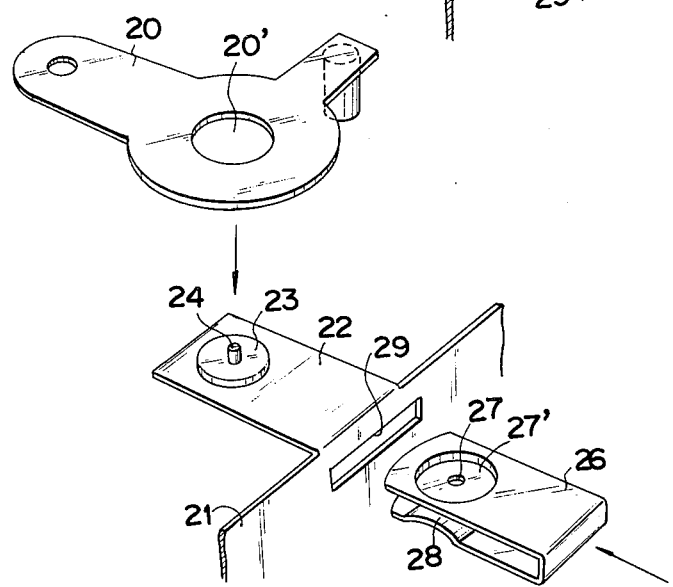
FIG. 6 and FIG. 7 show modifications of the above embodiment.
Figure 7:
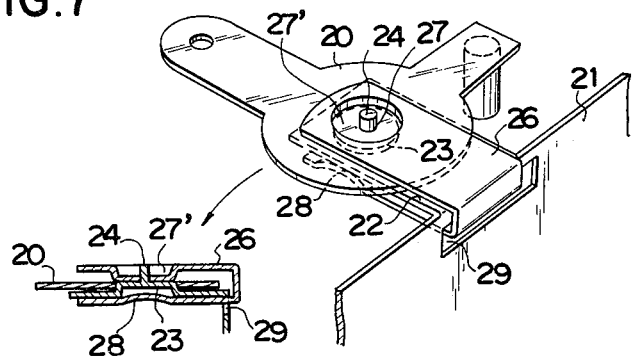

Alternatively, a circular recess 27' (inwardly projecting portion) may be formed around the through bore 27 in the plate spring 26 as shown in FIG. 6 and FIG. 7 instead of employing the projections 25 on the front plate 22.

Next, various modifications of each part of the indicator mechanism according to the invention as described above will be explained hereunder.

FIGS. 8A and 8B illustrate a torsion coil spring 30 which comprises a coil portion 30a in its central portion and a pair of arms 30b, 30c outwardly extending from the coil portion in opposite directions, respectively. The first arm 30b is formed with a hook so as to be connected to a lateral edge of the pointer arm 2 as in a conventional arrangement for (FIG. 1). On the other hand, the second arm 30c is formed in a straight line configuration longer than a conventional one to be connected to the slidable plate 4.

FIGS. 9A and 9B illustrate the slidable plate 4 used in an indicator mechanism according to the invention. The slidable plate 4 is formed with tunnel-like through holes 4a for allowing the straight arm 30c of the spring 30 to pass therethrough. The holes 4a each are formed by providing a pair of parallel splits in the slidable plate 4 and thereafter raising up the split portion from the surface of the slidable plate 4. Thus, the straight arm 30c is inserted in the holes 4a so as to pass through them along the surface of the slidable plate 4.

FIG. 10 illustrates an assembled structure of the indicator mechanism according to the invention. The spring 30 is mounted, as a conventional arrangement, by coupling its coil portion 30a around the pin 3 for pivotally supporting the pointer arm 2 as well as the slidable plate 4 and by hooking on the first arm 30b to a lateral edge of the pointer arm 2. The straight arm 30c of the spring 12 is arranged to extend along the surface of the slidable plate 4 and pass through the holes 4a. That is, the straight arm 30c is capable of axially moving within the holes 4a. However, it is secured so as not to move laterally by the walls of the holes 4a, thereby applying a tightening force to the coil portion 30a of the spring 30. Therefore, a torsion is applied between the pointer arm 2 and the slidable plate 4.

As apparent from the above-described embodiments, the spring assembly according to the present invention places an arm of the torsion coil spring in a straight line and in engagement with the slidable plate so as to be movable axially with respect to the slidable plate. Therefore, even if the pointer arm and the slidable plate pivot oppositely so as to apply a tightening force to the coil portion of the spring, the spring can freely expand and shrink due to its movable engagement of one of the arms. Thus, there do not occur such problems wherein the diameter of the coil portion may be reduced and the coil portion may accordingly dig into the pin and engage it to thereby disturb smooth pivotal movement. Therefore, according to the present invention, it is possible to secure smooth pivotal movement of the pointer arm and the slidable plate.

FIG. 11 and FIG. 12 illustrate a structure according to the present invention adapted to slidably mount the base end of the pointer arm 2 of for example FIG. 1 on a rear wall of the casing. The reference numeral 41 designates a long slit formed in the base end portion of the pointer arm 2 so as to extend along the longitudinal direction of the pointer arm. The reference numeral 42 designates a rear wall of the casing of the pushbutton tuner. The rear wall 42 is provided a protrusion 43 integrally formed therewith and upwardly directed. The rear wall 42 is also formed with nicks 43a in the upper end thereof at the both sides of the protrusion 43. The nicks 43a are arranged to meet with the planes extending along both sides of the long slit 41 of the pointer arm 2.

The reference numeral 44 designates a coupling made of a plastic material, for example. The coupling 44 comprises a rod portion 44b and a flange 44a formed on the rod portion 44b. The rod portion 44b has such a diameter as to loosely engage with the long slit 41 of the pointer arm 2, and on the other hand, the flange 44a has a diameter larger than the width of the long slit 41. The coupling 44 is also formed with a bore 44c along the axis thereof so that the protrusion 43 of the rear wall 42 may be inserted in the bore 44c.

These parts are assembled as follows. First, the pointer arm 2 is disposed in an upper portion of the rear wall 42 of the casing in such a manner to receive the protrusion 43 in its long slit 41. Consequently, the rod portion 44b of the coupling 44 is inserted in the long slit 21 so as to receive the protrusion 43 of the rear wall 42 in its bore 44c in a close contact therewith. Accordingly, the pointer arm 2 is supressed by the flange 44a of the coupling 44 to be thereby disposed on the rear wall 42 of the casing. In this case, the pointer arm 2 is in engagement with the coupling 44 through the long slit 41 thus to be movable along the longitudinal direction thereof and rotatable about the coupling 44.

Incidentally, a modification of the above assembling structure is shown in FIG. 13 and FIG. 14. In these drawings, the reference numeral 44d designates a groove which may be formed along the entire periphery of the rod portion 44b to thereby have a ring-like configuration or may be formed solely in a portion to be in contact with the pointer arm 2. Due to the presence of the groove 44d, the rod portion 44b and the flange 44a are formed in a condition perfectly intersecting with each other. Therefore, a precise disposition of the pointer arm 2 in the long slit 41 can be attained, thus preventing it from loosening.

The reference numeral 44e designates a recess disposed in the lower edge of the bore 44c for serving as a relief of fin or flash which may remain at a base portion of the projection 43.

As apparent from the above-described embodiments, according to the structure of the present invention, the pointer arm can be mounted solely by pressing the coupling 44 to the protrusion 43 of the casing, thus rendering the assemblage and disassemblage of the coupling much easier than a conventional one. Therefore, according to the present invention, it is possible to reduce the man-hour for assembling the pointer arm as well as to replace the indicating pointer 2 in a prompt and easy manner. Further, there is no need of providing a guide slit in the casing or a protrusion and a pin on the pointer arm, thus simplifying the whole structure, resulting in a reduction of the production cost. Additionally, both ends of the long slit of the pointer arm 2 may be formed round conform to the rod portion 44b of the coupling 44. Thus, impact force of the pointer arm and the coupling can be reduced to thereby eliminate noises caused by the contact of the indicating pointer with the back plate as well as other drawbacks.

Particularly, there generally remains a fin or flash along the edge of the long slit 41 as a result of the punching operation, and the fin or flash may sometimes disturb the movement of the pointer arm. However, according to the present invention, there are formed the nicks 44d at both sides of the protrusion and the edge of the long slit is disposed in the nicks. Therefore, even if any fin or flash exists, it is possible to secure smooth movement of the pointer arm.

We claim:

1. In an indicator mechanism in a pushbutton tuner, said mechanism including an arm member pivotally mounted at a base end portion thereof to a stationary element in said tuner and provided with an indicating pointer at the opposite end thereof; a generally planar member pivotally connected to said arm member and having a first bore passing between the major faces thereof; a plate member extending from a casing of the pushbutton tuner; bearing means for pivotally mounting said planar member to said plate member; operating means connected between a pushbutton of the pushbutton tuner and said planar member for causing pivotal movement of the planar member and thereby displacing said arm member as said operating means is moved, the improvement wherein said bearing means comprises:

a generally cylindrical projecting first protrusion formed outwardly extending from a first face of said plate member and projecting into and receiving said first bore formed in said planar member so as to pivotally support said planar member; and a holding member having an open rectangular configuration formed by a first and a second generally parallel spaced confronting plates having inner and outer ends, and interior face of said first confronting plate bearing against a second face of said plate member and on interior face of said second confronting plate extending over said first face of said plate member, said confronting plates being resiliently joined at the outer ends of said confronting plates so as to captively hold said planar member against said plate member with said bore of said planar member pivotally surrounding said first protrusion;

a smaller second protrusion disposed on one of said second confronting plate and said first protrusion, the other of said second confronting plate and said first protrusion having a second bore therein configured to closely receive said second protrusion.

2. The indicator mechanism as set forth in claim 1, wherein said plate member is provided on said first face thereof with at least one of the outwardly extending protrusions thereon for supporting said holding member by engaging against said second plate thereof.

3. The indicator mechanism as set forth in claim 1 wherein said second plate of said holding member is configured with an inwardly projecting portion containing the second bore of the holding member and configured so as to press against said first protrusion formed on said plate member to hold said planar member pivotally captive about said first protrusion on said plate member.

4. The indicator mechanism as set forth in claim 1, further comprising a spring disposed at the junction of said arm member and said planar member.

5. The indicator mechanism as set forth in claim 4, wherein said planar member is formed with a hole passing through and located along the surface thereof and said spring comprises a coil portion and arm portions extending from both ends of the coil portion, respectively, one of said arm portions being connected to said arm member and the other arm portion being inserted in said hole.

6. The indicator mechanism as set forth in claim 1, wherein said arm member is formed with a slit at the base end portion thereof said mechanism further comprising a coupling member for slidably mounting said arm member on a rear wall of the casing through said slit, said coupling member having means for press-on removable attachment to said rear wall and means for slidingly retaining said arm member thereto by engagement with said slit.

7. The indicator mechanism as set forth in claim 6, wherein said rear wall of the casing is formed with a protrusion and said coupling member is configured with a through bore and comprises a rod portion for freely playing in said slit and a flange portion having a diameter larger than the width of said slit, said protrusion of said rear wall of the casing being configured to be capturingly removably inserted in said through bore of the coupling member.

8. The indicator mechanism as set forth in claim 7, wherein said coupling member is provided with a groove formed along the borderline between the rod portion and the flange portion.

9. The indicator mechanism of claim 1 wherein a portion of said casing from which said plate member projects is configured with at least one slot proximate to said plate member so as to insertingly accept one of said confronting plates of said holding member.

10. The indicator mechanism of claim 1 wherein said second bore and said second protrusion are respectively on said second confronting plate of said holding member and said plate member.

* * * * *